US009041059B2

(12) United States Patent
Liao et al.

(10) Patent No.: US 9,041,059 B2
(45) Date of Patent: May 26, 2015

(54) SEMICONDUCTOR STRUCTURE FOR ANTENNA SWITCHING CIRCUIT

(71) Applicant: MAXTEK TECHNOLOGY CO., LTD., Taipei (TW)

(72) Inventors: Ke-Kung Liao, Taipei (TW); Tung-Sheng Chang, Taipei (TW); Chun-Yen Ku, Taipei (TW); Shih-Yu Chen, Taipei (TW)

(73) Assignee: MAXTEK TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 13/886,778

(22) Filed: May 3, 2013

(65) Prior Publication Data

US 2014/0027877 A1    Jan. 30, 2014

(30) Foreign Application Priority Data

Jul. 27, 2012    (TW) .............................. 101127118 A

(51) Int. Cl.
*H01L 31/072*    (2012.01)
*H01L 29/40*    (2006.01)
*H01L 29/66*    (2006.01)
*H01L 29/812*    (2006.01)
*H01L 29/872*    (2006.01)

(52) U.S. Cl.
CPC ............ *H01L 29/872* (2013.01); *H01L 29/402* (2013.01); *H01L 29/404* (2013.01); *H01L 29/66143* (2013.01); *H01L 29/812* (2013.01)

(58) Field of Classification Search
CPC .............. H01L 29/872; H01L 2/66143; H01L 29/66462; H01L 29/668489
USPC ................. 257/192, 197–198, 527, 565, 763; 438/235, 309, 312, 317
See application file for complete search history.

(56) References Cited

U.S. PATENT DOCUMENTS 6,548,838 B1 *    4/2003    Anda et al. .................... 257/192

* cited by examiner

*Primary Examiner* — Dung A. Le
(74) *Attorney, Agent, or Firm* — Muncy, Geissler, Olds & Lowe, P.C.

(57) ABSTRACT

A manufacturing method for antenna switching circuit includes the following steps of: providing a GaAs wafer, which includes a capping layer; disposing an isolation layer to the GaAs wafer for forming a device area; and disposing a gate metal on the capping layer within the device area, wherein an interface between the gate metal and the capping layer forms a Schottky contact, and the Schottky contact is parallel connected with an impedance. The present invention also discloses a semiconductor structure for antenna switching circuit.

5 Claims, 3 Drawing Sheets

SEMICONDUCTOR STRUCTURE FOR ANTENNA SWITCHING CIRCUIT

CROSS REFERENCE TO RELATED APPLICATIONS

This Non-provisional application claims priority under 35 U.S.C. §119(a) on Patent Application No(s). 101127118 filed in Taiwan, Republic of China on Jul. 27, 2012, the entire contents of which are hereby incorporated by reference.

BACKGROUND OF THE INVENTION

1. Field of Invention

The invention relates to a semiconductor structure and a manufacturing method thereof and, in particular, to a semiconductor structure and a manufacturing method thereof for an antenna switching circuit.

2. Related Art

Due to the wide development of the wireless communication technology, the marketing demand for the antenna has been raised rapidly. Nowadays, the wireless communication apparatuses, such as cell phones, notebook computers, global positioning systems, digital televisions, and portable electronic apparatuses, rely on antennas for transmitting and receiving signals. In other words, the antenna is an essential device to the wireless communication apparatus for communicating with the outside world by transmitting and receiving wireless signals. The antenna configured for transmitting and receiving wireless signals gives enormous affection to the signal quality and the performance of the wireless communication.

Due to the different requirements, many areas have their respective wireless communication standards that comply with several frequency bands. For fitting more standards, it's getting common to design an antenna that can transmit and receive the signals of multiple frequency bands. In the circuit design, the multi-band effect can be achieved by separating different feed-in signals through a switching circuit.

Accordingly, the antenna switching circuit also affects the signal quality and the performance of the antenna. Therefore, it is an important subject to provide a semiconductor structure and a manufacturing method thereof for an antenna switching circuit that can improve the voltage-resistant level and anti-noise ability of the antenna switching circuit so as to improve the signal quality of the antenna.

SUMMARY OF THE INVENTION

In view of the foregoing subject, an objective of the invention is to provide a semiconductor structure and a manufacturing method thereof for an antenna switching circuit that can improve the voltage-resistant level and anti-noise ability of the antenna switching circuit so as to improve the signal quality of the antenna.

To achieve the above objective, a manufacturing method for antenna switching circuit according to this invention includes the following steps of: providing a GaAs wafer, which includes a capping layer; disposing an isolation layer to the GaAs wafer for forming a device area; and disposing a gate metal to the capping layer within the device area, wherein an interface between the gate metal and the capping layer forms a Schottky contact, and the Schottky contact is parallel connected with an impedance. The present invention also discloses a semiconductor structure for antenna switching circuit.

In one embodiment, the GaAs wafer includes a buffer layer, a channel layer, a space layer, a donor layer and a capping layer.

In one embodiment, the isolation layer is disposed to the GaAs wafer by an ion implantation.

In one embodiment, the gate metal is disposed on the capping layer by a vapor deposition.

In one embodiment, the material of the gate metal includes Au, Pt, Al, Ti, or Ni.

In one embodiment, the manufacturing method further includes steps of disposing a first ohmic layer and a second ohmic layer on the capping layer; and disposing a first metal layer on the first ohmic layer and the gate metal and disposing a second metal on the second ohmic layer.

In one embodiment, the first ohmic layer adjoins the gate metal.

To achieve the above objective, a semiconductor structure for antenna switching circuit according to this invention comprises a buffer layer, a channel layer, a space layer, a donor layer, a capping layer, an isolation layer and a gate metal. The channel layer is disposed on the buffer layer. The space layer is disposed on the channel layer. The donor layer is disposed on the space layer. The capping layer is disposed on the donor layer. The isolation layer is disposed on the buffer layer and adjoins the channel layer, the space layer, the donor layer and the capping layer for forming a device area. The gate metal is disposed to the capping layer within the device area. The gate metal and the capping layer have an interface.

In one embodiment, the isolation layer is made by insulating material, and is disposed by an ion implantation.

In one embodiment, the gate metal is disposed at the capping layer by a vapor deposition.

In one embodiment, the material of the gate metal includes Au, Pt, Al, Ti, or Ni.

In one embodiment, the interface between the gate metal and the capping layer forms a Schottky contact, and the Schottky contact is parallel connected with an impedance.

In one embodiment, the semiconductor structure further includes a first ohmic layer, a second ohmic layer, a first metal layer and a second metal layer. The first ohmic layer and the second ohmic layer are disposed on the capping layer. The first metal layer is disposed on the first ohmic layer and the gate metal. The second metal is disposed on the second ohmic layer.

In one embodiment, the first ohmic layer adjoins the gate metal.

As mentioned above, in the semiconductor structure for antenna switching circuit and manufacturing method thereof according to the invention, the hetero-interface between the gate metal and the capping layer forms a Schottky contact, and the Schottky contact is parallel connected with an impedance. Thereby, the voltage-resistant level and anti-noise ability of the antenna switching circuit are improved, so that the signal quality of the antenna is enhanced for bringing the extremely high marketing potential.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
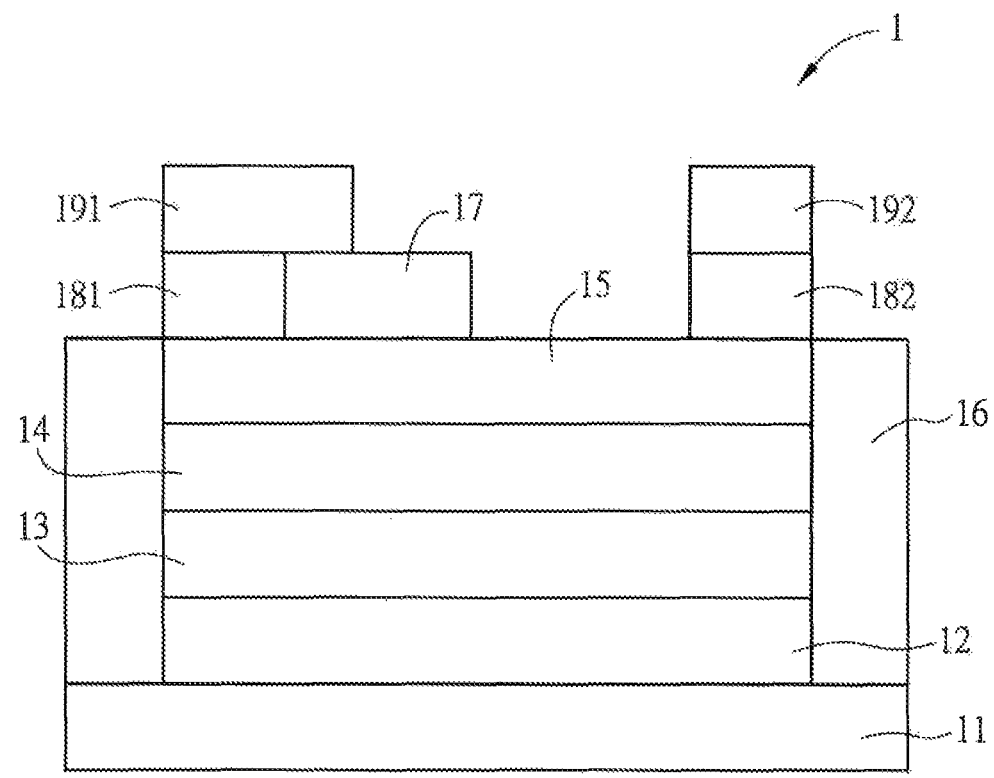
FIG. 1A is a schematic diagram of a semiconductor structure, of a preferred embodiment of the invention, for an antenna switching circuit.

FIG. 1A is a schematic diagram of a semiconductor structure, of a preferred embodiment of the invention, for an antenna switching circuit. The semiconductor structure 1, includes a buffer layer 11, a channel layer 12, a space layer 13, a donor layer 14, a capping layer 15, an isolation layer 16 and a gate metal 17. In this embodiment, the buffer layer 11, the channel layer 12 and the space layer 13 are undoped.

The material of the buffer layer 11 is GaAs for example. Herein, the buffer layer 11 is regarded as a substrate, and other semiconductor layers can be disposed on the buffer layer 11.

The channel layer 12 is disposed on the buffer layer 11. The material of the channel layer 12 is InGaAs for example. The space layer 13 is disposed on the channel layer 12. The material of the space layer 13 is AlGaAs for example.

The donor layer 14 is disposed on the space layer 13. The material of the donor layer 14 is AlGaAs for example.

The capping layer 15 is disposed on the donor layer 14. The material of the capping layer 15 is GaAs for example.

The isolation layer 16 is disposed on the buffer layer 11, and adjoins the channel layer 12, the space layer 13, the donor layer 14 and the capping layer 15. The isolation layer 16 is used to isolate the inside semiconductor structure from the outside semiconductor structure so that a device area is formed inside the isolation layer 16. The isolation layer 16 is made by insulating material, and can be disposed by an ion implantation.

The gate metal 17 is disposed on the capping layer 15 within the device are to form an interface. The material of the gate metal 17 includes Au, Pt, Al, Ti, or Ni, or other kinds of conductive metals. The gate metal 17 can be disposed by for example, physical vapor deposition (PVD) or chemical vapor deposition (CVD).

Besides, as an embodiment, the semiconductor structure 1 can further include a first ohmic layer 181, a second ohmic layer 182, a first metal layer 191 and a second metal layer 192. The first ohmic layer 181 and the second ohmic layer 182 are disposed on the capping layer 15. The first metal layer 191 is disposed on the first ohmic layer 181 and the gate metal 17. The second metal layer 192 is disposed on the second ohmic layer 182.

Herein, the first and second metal layers 191 and 192 function as electrical. connection points of the semiconductor structure 1 for connecting to other electronic devices (not shown) by conductive wires for example.

Besides, in this embodiment, the first ohmic layer 181 adjoins the gate metal 17. However in other embodiments, they may not be adjacent to each other.

To be noted, the dimensions, such as the heights or widths, as shown in FIG. 1A are just for example, but not for representing the practical cases.

Figure 1B:
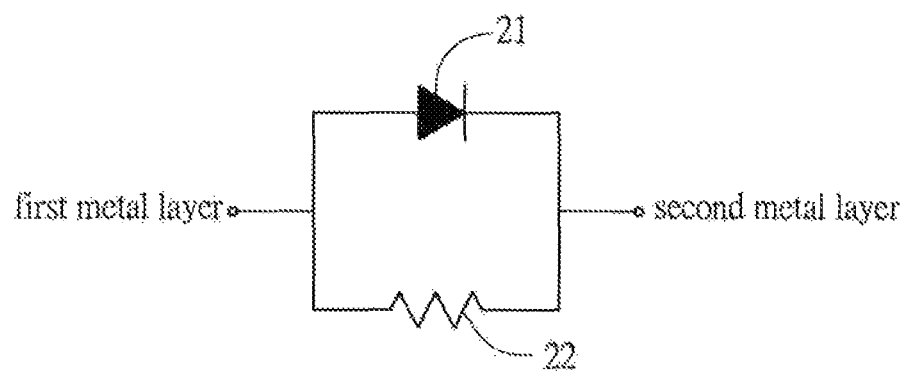
FIG. 1B is a schematic diagram of an equivalent circuit of a semiconductor structure, of a preferred embodiment of the invention, for an antenna switching circuit.

FIG. 1B is a schematic diagram showing an equivalent circuit. As shown in FIGS. 1A and 1B, in this embodiment, when the gate metal 17 is disposed on the capping layer and thus contacts the donor layer 14, a Schottky barrier will be caused at the interface (i.e. the so-called heterojunction) of the gate metal 17 and the donor layer 14 so that the interface forms a Schottky contact. The Schottky contact is parallel connected to an impedance that is formed by the internal resistance of the capping layer 15. In other words, in this embodiment, between the first and second metal layers 191 and 192 is regarded as an equivalent circuit of a parallel connection of a Schottky diode 21 and a resistor 22 as shown in FIG. 1B. The Schottky contact and the impedance parallel connecting to the Schottky contact that are caused by the interface of the gate metal 17 and the capping layer 15 can improve the voltage-resistant level and anti-noise ability of the antenna switching circuit.

Figure 2:
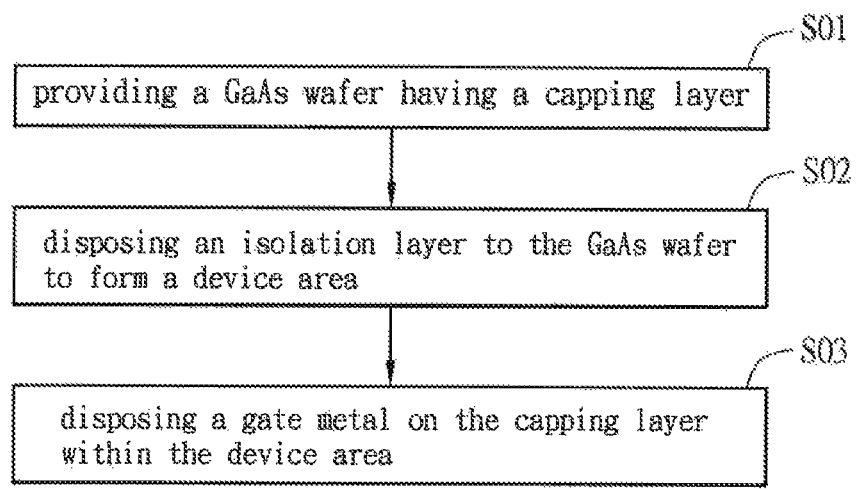
FIG. 2 is a flowchart of a manufacturing method of a semiconductor structure, of a preferred embodiment of the invention, for an antenna switching circuit.
Figure 3A:
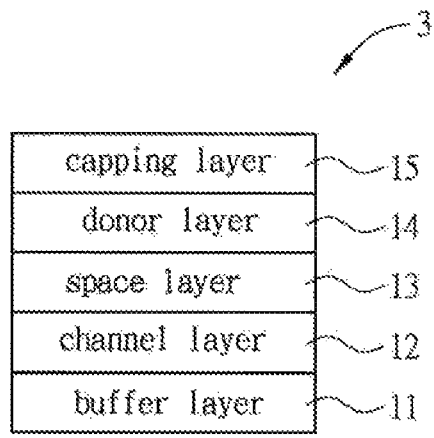
FIG. 3A is a schematic diagram of a GaAs wafer of a preferred embodiment of the invention.
Figure 3B:
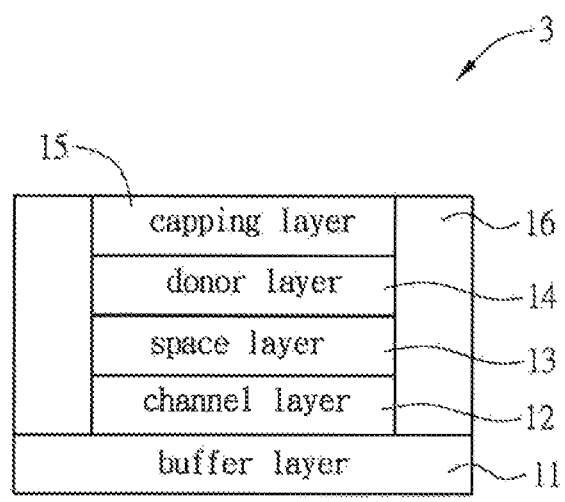
FIG. 3B is a schematic diagram of the GaAs wafer having the isolation layer of a preferred embodiment of the invention.

The manufacturing method for antenna switching circuit according to a preferred embodiment of the invention will be illustrated by referring to the flowchart as shown in FIG. 2 with FIG. 1A and FIGS. 3A to 3B. The manufacturing method can be used. to manufacture the semiconductor structure 1 that is applied to antenna switching circuit. The manufacturing method includes the steps S01 to S03.

The step S01 is to provide a GaAs wafer 3. FIG. 3A is a schematic diagram of the GaAs wafer 3. The GaAs wafer 3 includes a buffer layer 11, a channel layer 12, a space layer 13, a donor layer 14 and a capping layer 15.

In this embodiment, the buffer layer 11 functions as a substrate, and the material of the buffer layer 11 is GaAs. The channel layer 12 is disposed on the buffer layer 11, and the material of the channel layer 12 is InGaAs. The space layer 13 is disposed on the channel layer 12, and the material of the space layer 13 is AlGaAs. The donor layer 14 is disposed on the space layer 13, and the material of the donor layer 14 is AlGaAs. The capping layer 15 is disposed on the donor layer 14, and the material of the capping layer 15 is GaAs.

To be noted, the dimensions of each of the semiconductor layers as shown in FIGS. 3A to 3B are just for example, but not for representing the practical cases. Besides, the structure of the semiconductor structure is just for example, and can be varied according to different applications or requirements.

The step S02 is to dispose an isolation layer 16 to the GaAs wafer 3 to form a device area. FIG. 3B is a schematic diagram of the GaAs wafer 3 having the isolation layer 16. In this embodiment, the isolation layer 16 is disposed to the buffer layer 11 by an ion implantation. The isolation layer 16 can isolate the inside semiconductor structure from the outside semiconductor structure so that a device area is formed inside the isolation layer 16. The material of the isolation layer 16 is insulating material.

The step S03 is to dispose a gate metal 17 on the capping layer 15 within the device area. FIG. 1A is a schematic diagram of the semiconductor structure 1 for antenna switching circuit according to a preferred embodiment of the invention. As shown in FIGS. 1A and 3B, in this embodiment, the gate metal 17 is disposed on the capping layer 15 within the device area by a vapor deposition. The vapor deposition is, for example, physical vapor deposition (PVD) or chemical vapor deposition (CVD). In other embodiments, the gate metal 17 can be disposed by other methods. The material of the gate metal 17 includes Au, Pt, Al, Ti, or Ni, or other kinds of conductive metals.

Besides, the manufacturing method can further include steps of: disposing a first ohmic layer 181 and a second ohmic layer 182 on the capping layer 15; disposing a first metal layer 191 on the first ohmic layer 181 and the gate metal 17; and disposing a second metal layer 192 on the second ohmic layer 182. Herein, the first and second metal layers 191 and 192 function as electrical connection points of the semiconductor structure 1 for connecting to other electronic devices (not shown) by conductive wires for example. In this embodiment, the first ohmic layer 181 can adjoin the gate metal 17 or not.

By referring to FIG. 1B, after the manufacturing process, a Schottky barrier will be caused at the interface (i.e. the so-called heterojunction) of the gate metal 17 and the capping layer 15 so that the interface forms a Schottky contact. The Schottky contact is parallel connected to an impedance that is formed by the internal resistance of the capping layer 15. In other words, in this embodiment, between the first and second metal layers 191 and 192 is regarded as an equivalent circuit of a parallel connection of a Schottky diode 21 and a resistor 22 as shown in FIG. 1B. The Schottky contact and the impedance parallel connecting to the Schottky contact that are caused by the interface of the gate metal 17 and the capping layer 15 can improve the voltage-resistant level and anti-noise ability of the antenna switching circuit.

In summary, in the semiconductor structure for antenna switching circuit and manufacturing method thereof according to the invention, the hetero-interface between the gate metal and the capping layer forms a Schottky contact, and the Schottky contact is parallel connected with an impedance. Thereby, the voltage-resistant level and anti-noise ability of the antenna switching circuit are improved, so that the signal quality of the antenna is enhanced for bringing the extremely high marketing potential.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A semiconductor structure for an antenna switching circuit, comprising:
    a buffer layer;
    a channel layer disposed on the channel layer;
    a space layer disposed on the channel layer;
    a donor layer disposed on the space layer;
    a capping layer disposed on the donor layer;
    an isolation layer disposed on the buffer layer, and adjoining the channel layer, the space layer, the donor layer and the capping layer to form a device area;
    a gate metal disposed to the capping layer within the device area, wherein the gate metal and the capping layer have an interface;
    a first ohmic layer disposed on the capping layer and contacted to the gate metal; and
    a first metal layer disposed on the first ohmic layer and the gate metal.

2. The semiconductor structure as recited in claim 1, wherein the material of the gate metal includes Au, Pt, Al, Ti, or Ni.

3. The semiconductor structure as recited in claim 1, wherein the interface of the gate metal and the donor layer is configured with a Schottky contact and an impedance connecting with the Schottky contact in parallel.

4. The semiconductor structure as recited in claim 1, further comprising:
    a second ohmic layer disposed on the capping layer;
    a second metal layer disposed on the second ohmic layer.

5. The semiconductor structure as recited in claim 4, wherein the first ohmic layer adjoins the gate metal.

\* \* \* \* \*